(12) United States Patent
Sheehan

(10) Patent No.: US 8,545,962 B2
(45) Date of Patent: Oct. 1, 2013

(54) NANO-FIBER ARRAYED SURFACES

(75) Inventor: Daniel Peter Sheehan, San Diego, CA (US)

(73) Assignee: Paradigm Energy Research Corporation, Poway, CA (US)

(*) Notice: Subject to any disclaimer, the term of this patent is extended or adjusted under 35 U.S.C. 154(b) by 901 days.

(21) Appl. No.: 11/832,625

(22) Filed: Aug. 1, 2007

(65) Prior Publication Data
US 2008/0138577 A1 Jun. 12, 2008

Related U.S. Application Data

(60) Provisional application No. 60/835,771, filed on Aug. 7, 2006, provisional application No. 60/913,364, filed on Apr. 23, 2007.

(51) Int. Cl.
*B32B 3/00* (2006.01)
*B05D 1/12* (2006.01)
*G03C 5/00* (2006.01)
*C23C 14/00* (2006.01)

(52) U.S. Cl.
USPC .............. 428/113; 257/52; 257/77; 257/379; 257/382; 257/401; 428/105

(58) Field of Classification Search
USPC ............... 428/113, 105; 255/77; 257/77, 257/53, 379, 382, 401
See application file for complete search history.

(56) References Cited

U.S. PATENT DOCUMENTS

| | | | |
|---|---|---|---|
| 2002/0014667 A1* | 2/2002 | Shin et al. | 257/368 |
| 2003/0197456 A1* | 10/2003 | Den et al. | 313/309 |
| 2004/0016928 A1* | 1/2004 | Ravi et al. | 257/77 |
| 2004/0096607 A1* | 5/2004 | Kelley et al. | 428/35.3 |
| 2005/0142933 A1* | 6/2005 | Beer et al. | 439/540.1 |
| 2006/0052509 A1* | 3/2006 | Saitoh | 524/496 |
| 2006/0115640 A1* | 6/2006 | Yodh et al. | 428/221 |

OTHER PUBLICATIONS

Burghard, et al., "Controlled Adsorption of Carbon Nanotubes on Chemically Modified Electrode Arrays", Advanced Materials, (1998) 10, No. 8, p. 584-588, Wiley-VCH Verlag GmbH, Weinheim, Germany.

Cumings, et al., "Low-Friction Nanoscale Linear Bearing Realized from Multiwall Carbon Nanotubes", Science, (Jul. 28, 2000), vol. 289, p. 602-604.

Liu, et al., "Controlled deposition of individual single-walled carbon nanotubes on chemically functionalized templates", Chemical Physics Letters (Apr. 2, 1999) 303 p. 125-129, Elsevier Science B.V.

Sheehan, et al., "A Solid-State Maxwell Demon", Foundations of Physics, (Oct. 2002), vol. 32, No. 10, p. 1557-1595.

(Continued)

*Primary Examiner* — Brent O'Hern
(74) *Attorney, Agent, or Firm* — Knobbe, Martens, Olson & Bear LLP

(57) ABSTRACT

Surfaces are provided comprising an array of partially embedded nano-fibers. Two such surfaces may contact each other such that the respective nano-fibers contact at orthogonal angles, resulting in ultra-low friction and ultra-low adhesion contact. Such configurations are useful in several NEMS or MEMS applications, as well as macro-sized applications. Alternatively, the surfaces may contact each other such that the respective nano-fibers are parallel. These configurations are useful in micro-stage or high-order three-dimensional self assembly applications.

12 Claims, 13 Drawing Sheets

(56) References Cited

OTHER PUBLICATIONS

Sheehan, et al. "Intrinsically biased, resonant NEMS-MEMS oscillator and the second law of thermodynamics", Science Direct, (2005) Physica E 29 p. 87-99, Elsevier B.V.

Wright, et al., "Modeling a Submicrometer Electrostatic Motor", Journal of Nanoscience and Nanotechnology, (2003), vol. 3, No. 4, p. 329-334, American Scientific Publishers.

* cited by examiner

TARGET SURFACE

CNT AEROSOL STREAM

404

AEROSOL SMOKE

He

36 V
0.55 A

PIEZOELECTRIC DRIVER

COOH-MWCNT SOLUTION 402  400

FIG. 13

NANO-FIBER ARRAYED SURFACES

CROSS-REFERENCE TO RELATED APPLICATIONS

This application claims the benefit of U.S. provisional application Ser. No. 60/835,771, filed Aug. 7, 2006 and entitled "Nanotube Arrayed Surfaces," and U.S. provisional application Ser No. 60/913,364, filed Apr. 23, 2007 and entitled "Method for Dispersal and Surface Implantation of Nanotubes," both of which are incorporated herein by reference in their entirety.

BACKGROUND

1. Field of the Invention

The present invention relates to nano-engineered surfaces and particularly to surfaces arrayed with nano-fibers.

2. Description of the Related Art

Many nano-electromechanical systems (NEMS), micro-electromechanical systems (MEMS), and even macroscopic devices include contact between two surfaces during operation. In some cases, operation of such devices is optimized if the friction and/or adhesive (stiction) forces between the surfaces are minimized. However, in many applications, even where near atomically smooth surfaces and/or materials having inherently ultra-low adhesion or friction are used, the friction and adhesive forces that remain decrease efficiency and in some cases, prevent certain NEMS or MEMS devices from being realized. Thus, there is a need for surfaces having decreased friction and/or adhesion, better wear characteristics, and controllable surface contact fractions.

SUMMARY

One aspect of the present invention is an apparatus having a substrate comprising a surface and a plurality of nano-fibers partially embedded in the surface such that a portion of the embedded nano-fibers extend above the surface, wherein the nano-fibers are arranged such that their longitudinal dimension is substantially parallel to the surface.

Another aspect of the present invention is a system having a first member having a first surface, wherein a first set of nano-fibers are partially embedded in the first surface such that a portion of the first set of nano-fibers extend above the first surface, wherein the first set of nano-fibers are arranged such that their longitudinal dimension is substantially parallel to the first surface, and a second member having a second surface, wherein a second set of nano-fibers are partially embedded in the second surface such that a portion of the second set of nano-fibers extend above the second surface, wherein the second set of nano-fibers are arranged such that their longitudinal dimension is substantially parallel to the second surface.

Another aspect of the present invention is a nano-electromechanical system (NEMS) or micro-electromechanical system (MEMS) having a first member configured to move from a first position to a second position upon application of an electric field, the first member comprising a first surface, wherein a first set of nano-fibers are partially embedded in the first surface such that a portion of the first set of nano-fibers extend above the first surface, wherein the first set of nano-fibers are arranged such that their longitudinal dimension is substantially parallel to the first surface and to each other, and a second member comprising a second surface, wherein a second set of nano-fibers are partially embedded in the second surface such that a portion of the second set of nano-fibers extend above the second surface, wherein the second set of nano-fibers are arranged such that their longitudinal dimension is substantially parallel to the second surface and to each other, wherein when the first member is in said second position, the first set of nano-fibers contact the second set of nano-fibers at an angle.

Another aspect of the present invention is a self-assembled structure having a plurality of three-dimensional members, each member comprising at least one surface comprising a plurality of nano-fibers partially embedded therein such that a portion of the nano-fibers extend above the surface in which they are embedded, wherein the nano-fibers are arranged such that their longitudinal dimension is substantially parallel to the surface in which they are embedded and substantially parallel to other nano-fibers embedded in the same surface, wherein each nano-fiber-embedded surface contacts another nano-fiber-embedded surface such that the respective nano-fibers are substantially parallel to each other.

Another aspect of the present invention is a method of moving an object across a first surface, the method including placing a first substrate on the first surface, wherein the first substrate comprises a second surface facing away from the first surface, wherein a first set of nano-fibers are partially embedded in the second surface such that a portion of the first set of nano-fibers extend above the second surface, wherein the first set of nano-fibers are arranged such that their longitudinal dimension is substantially parallel to the second surface and to each other, placing a second substrate on the first substrate, wherein the first substrate comprises a third surface facing towards the second surface and a fourth surface facing away from the first and second surfaces, wherein a second set of nano-fibers are partially embedded in the third surface such that a portion of the second set of nano-fibers extend above the third surface, wherein the second set of nano-fibers are arranged such that their longitudinal dimension is substantially parallel to the third surface and to each other, wherein the second set of nano-fibers contact the first set of nano-fibers at an angle. The object is placed on the fourth surface and the second substrate is moved laterally relative to the first substrate.

Another aspect of the present invention is a method of manufacturing a low-friction surface, the method including forming a plurality of trenches in a substrate and placing a plurality of nano-fibers in the trenches.

BRIEF DESCRIPTION OF THE DRAWINGS

FIG. 13 is a cross-sectional view of an apparatus for forming an aerosol of a liquid with nano-fibers disposed therein.

DETAILED DESCRIPTION OF CERTAIN EMBODIMENTS

In one embodiment, an ultra-low friction and ultra-low adhesion surface is prepared by partially embedding a plurality of nano-fibers in a surface. As used herein, a nano-fiber refers to a cylindrical macromolecular structure having a diameter from about 0.1 nm to about 1000 nm. The nano-fibers may have any composition suitable for forming a fibril shape including but not limited to carbon, silicon nitride, boron nitride, or pure metals or alloys of pure metals. In some embodiments, the nano-fiber is substantially solid. In other embodiments, the nano-fiber is hollow to form a nanotube. The nanotube may be single-walled or multi-walled. When a carbon nanotube is used (e.g. a nanotube whose wall is a graphene sheet), it may have an armchair, zigzag, or chiral conformation. In various embodiments, the nano-fiber is chemically functionalized on its exterior surface, interior surface, or ends or is not functionalized. In some embodiments, one or both ends of the nano-fiber is capped. For example, in some embodiments, carbon nanotubes with hemispherical buckeyball caps are used.

Figure 1:
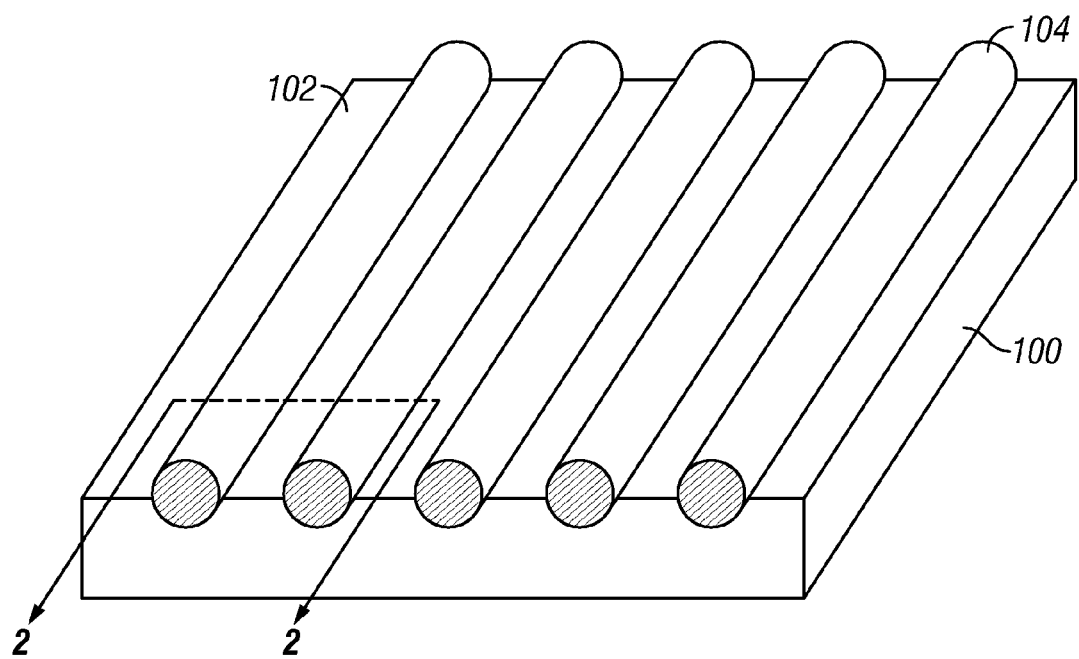
FIG. 1 is a perspective view of a substrate having parallelly-arranged partially embedded nano-fibers.

FIG. 1 is a perspective view depicting a substrate 100 with a contact surface 102 having nano-fibers 104 partially embedded therein with their longitudinal axis parallel to the plane of the surface 102. The array of nano-fibers 104 in the substrate 100 may be ordered in a regular array. For example, FIG. 1 depicts nano-fibers in a parallel arrangement with even spacing. However, as described in more detail below, any number of other arrangements are also possible.

Figure 2:
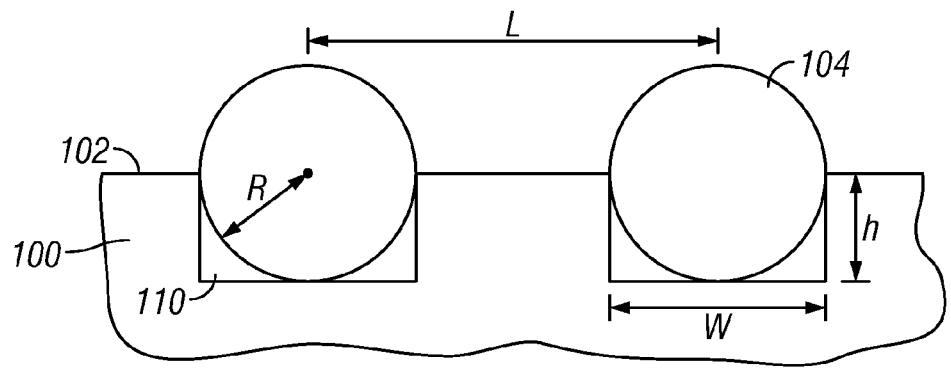
FIG. 2 is a cross-sectional view of nano-fibers seated within trenches.

Positioning and retaining of the nano-fibers 104 partially embedded in the substrate 100 may be facilitated by forming a plurality of trenches in the surface of the substrate 100. FIG. 2 is a cross-sectional view of the substrate 100 through cross section 2 of FIG. 1. The nano-fibers 104 have been positioned within trenches 110 formed in the substrate 100. The trenches 110 are characterized by width w, height h, and spacing L. In the embodiment depicted in FIG. 2, rectangular trenches 110 are used that are evenly spaced. However, trenches having any number of cross-sectional shapes may be utilized including but not limited to semi-circular and triangular. Furthermore, the spacing and arrangement may be uniform or non-uniform. If the nano-fibers' 104 diameter is greater than the height h of the trench 110, then a portion of the nano-fibers 104 will protrude above the surface 102 of the substrate 100. In the embodiment depicted in FIG. 2, the height h of the trench 110 is greater than the radius R of the nano-fibers 104. This configuration provides three points of contact between the outside surface of each nano-fiber 104 and the inside surface of a trench 110. van der Waals forces between the trench 110 and the nano-fiber 104 at these points of contact serve to keep the nano-fiber 104 seated within the trench 110 and to resist lateral movement of the nano-fiber 104.

Figure 3:
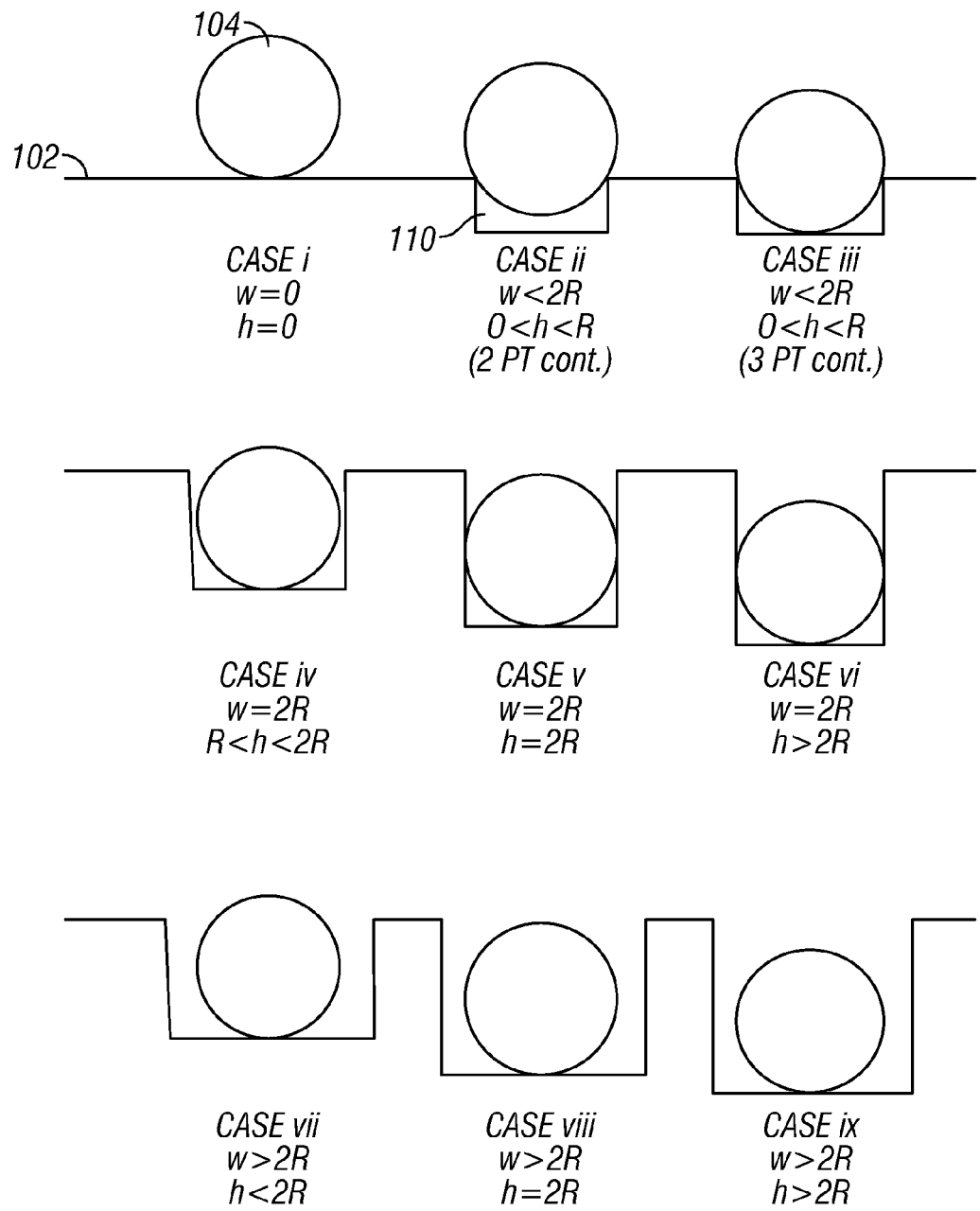
FIG. 3 is a cross-sectional view of nano-fibers seated within a variety of trench dimensions.

Several other possible nano-fiber-trench dimensions are depicted in cross section in FIG. 3. Case i represents nano-fibers 104 laying on top of a flat surface 102 having no trenches. This configuration provides no stability with respect to lateral movement and only one point of contact for which van der Waals forces resist lifting of the nano-fiber 104 from the surface. Case ii represents a narrow-trench case where the nano-fiber 104 cannot fit within the trench 110 and contact the bottom. This configuration provides some stability with respect to lateral movement but only two points of contact. Case iii represents a shallow-trench case were the nano-fiber 104 has three points of contact with the trench 110; however, since the height h of the trench 110 is less than the radius R of the nano-fiber 104, the nano-fiber 104 can still "roll" out of the trench 110 upon application of lateral forces. Case iv mirrors the case depicted in FIG. 2 where three points of contact are provided and the nano-fibers 104 should be resistant to lateral forces. In cases v and vi, no part of the nano-fibers 104 extend above the surface 102 of the substrate. Cases vii-ix represent wide-trench cases where the nano-fibers will have only one or two points of contact at any given time.

Figure 4:
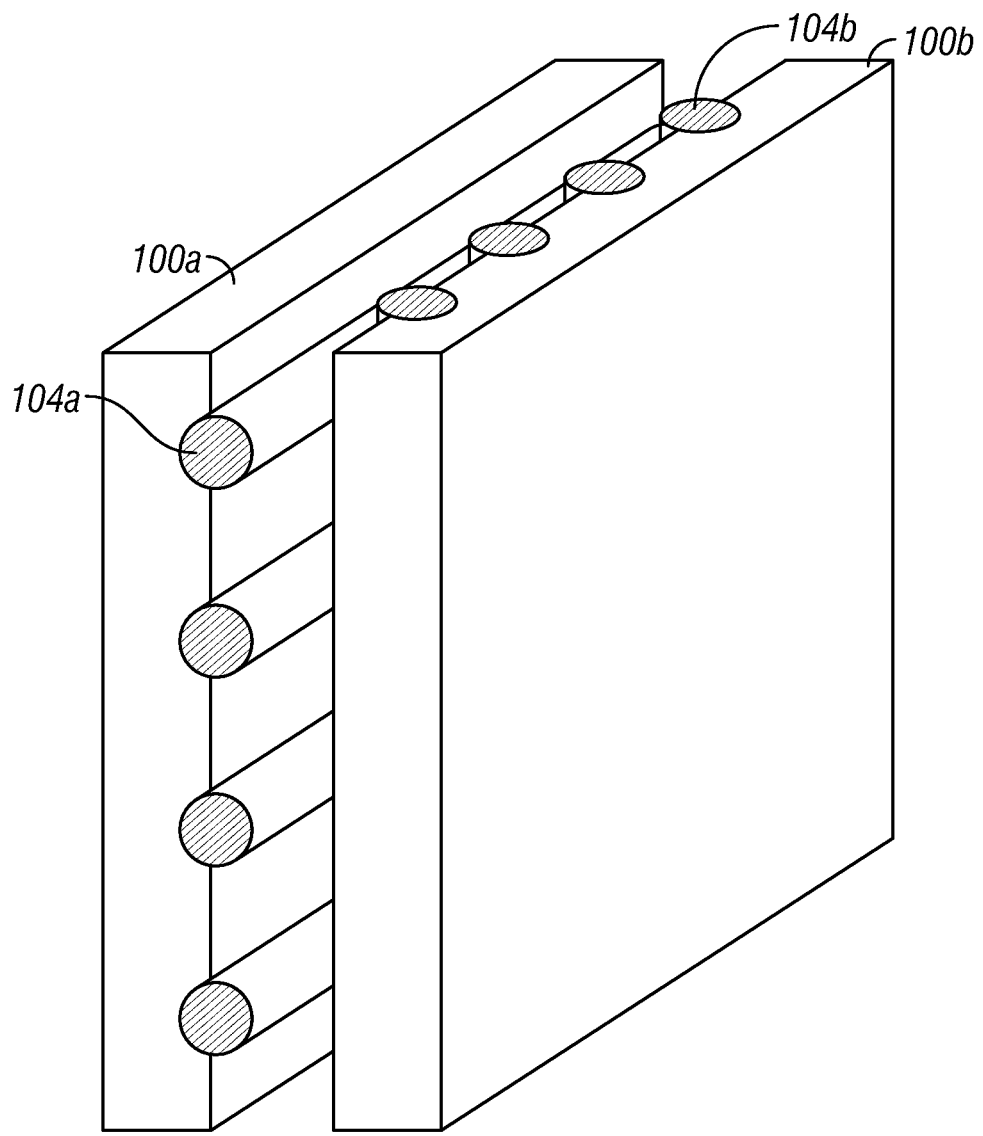
FIG. 4 is a perspective view of two surfaces comprising partially embedded nano-fibers contacting each other at orthogonal angles.

In some embodiments, systems and devices are provided that have two nano-fiber embedded substrates such as those depicted in FIG. 1 that may contact each other in a variety of configurations. One such configuration is depicted in FIG. 4. Each substrate 100a and 100b has a plurality of nano-fibers 104 partially embedded and parallelly aligned. In the embodiment depicted in FIG. 4, the set of nano-fibers 104a embedded in one substrate 100a contact the set of nano-fibers 104b embedded in the other substrate 100b at orthogonal angles. Because the points of contact occur only at the intersection of the nano-fibers, the result is a two-dimensional lattice of nearly point contacts which, as discussed in more detail below, provides ultra-low friction and ultra-low adhesion characteristics between the two substrates 100a and 100b. When nanotubes are used, tube flattening may increase the contact area; however, use of multi-walled nanotubes may decrease the effect of any tube flattening.

Figure 5:
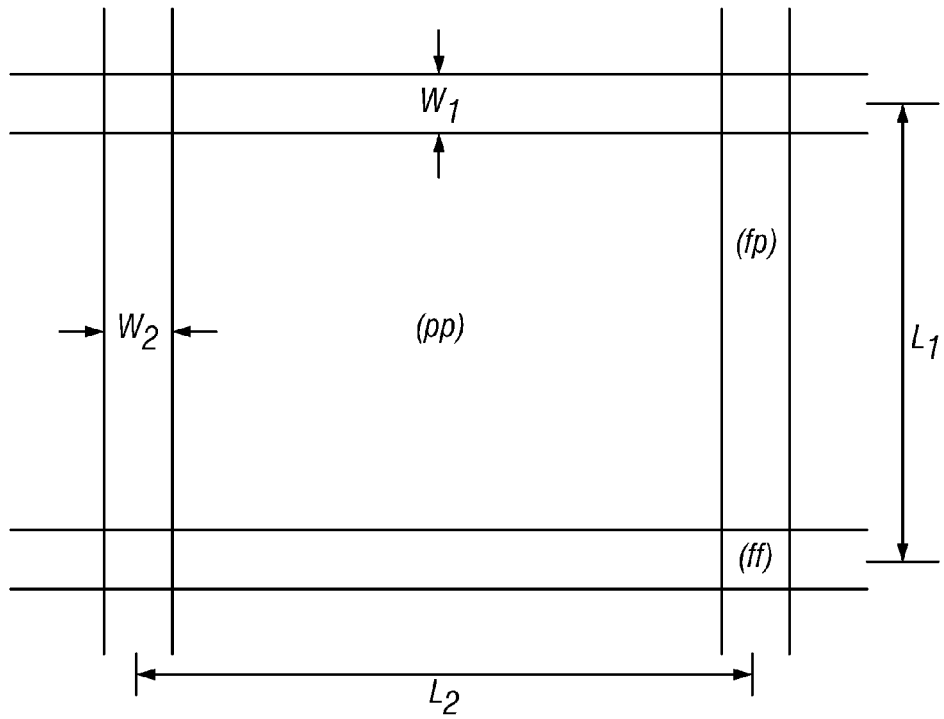
FIG. 5 is a vertical projection of orthogonally contacting nano-fibers.

In order to evaluate the frictional and adhesive forces at play between two substrates arranged as depicted in FIG. 4, it is useful to consider the vertical projection of the overlap of the various elements. FIG. 5 depicts such a vertical projection of a first substrate having parallel embedded nano-fibers of width $w_1$ evenly spaced a distance $L_1$ from each other overlaying a second substrate having parallel embedded nano-fibers of width $w_2$ evenly spaced a distance $L_2$ from each other. FIG. 5 illustrates that there are three regions of overlap: 1) the plane-plane (pp) region representing overlap between the two substrates, 2) the fiber-plane (fp) region representing overlap between a nano-fiber in one substrate with the other substrate, and 3) the fiber-fiber (ff) region representing overlap between a nano-fiber in one substrate with a nano-fiber in the other substrate. For each region, a geometric surface overlap fraction $\eta_1$ can be defined as the ratio of the overlap area to the total area of the substrate surface. For the case where $L_1=L_2=L$ and $w_2=w_2=2R$, the surface overlap fractions $\eta_1$ of each region for the unit cell depicted in FIG. 5 are described by the expressions listed in Table 1.

TABLE 1

Geometric surface overlap fractions for orthogonally-oriented arrays of nano-fibers.

| Overlap region | $\eta_1$ |
|---|---|
| plane-plane (pp) | $\left(1 - \dfrac{2R}{L}\right)^2$ |
| fiber-plane (fp) | $\dfrac{4R(L-2R)}{L^2}$ |
| fiber-fiber (ff) | $\left(\dfrac{2R}{L}\right)^2$ |

The adhesive forces between an orthogonally-oriented contact between nano-fiber embedded surfaces due to van der Waals interactions can be approximated using the Lifshitz treatment of Casimir forces, where the force per unit area between identical dielectric plates separated by distance z is given by:

$$f(z) = -\frac{\hbar}{8\pi^2 z^3} \int \frac{[\varepsilon(i\omega) - 1]^2}{[\varepsilon(i\omega) + 1]^2} d\omega \quad (1)$$

where $\varepsilon$ is the frequency-dependent dielectric function of the medium. The fiber-plane and fiber-fiber forces can be approximated by integrating the force due to differential areas over the curved surface of the nano-fiber. The force for a fiber-fiber or fiber-plane interaction is then given by:

$$F(z_{sep}) = \int f(z) dA \quad (2)$$

where $Z_{sep}$ is the distance between a nano-fiber and the opposing substrate or between two opposing nano-fibers and dA is the differential area.

The relative reduction in Casimir forces due to the separation of the various surfaces and the curvatures of the nano-fibers can be expressed in terms of a dimensionless weighting factor, $\eta_2$, which is defined as the ratio of the actual Casimir forces for each region when the orthogonal nano-fibers are at their minimum Casimir separation distance to the Casimir forces predicted for perfect atomic contact of flat planes. Solving equations (1) and (2) and using appropriate approximations provide the $\eta_2$ expressions listed in Table 2 for each region, assuming $w_1 = w_2 = 2R$.

TABLE 2

Casimir force weighting functions for orthogonally-oriented arrays of nano-fibers.

| Overlap region | $\eta_2$ |
|---|---|
| plane-plane (pp) | $\left(\dfrac{z_{cut}}{2R(1-e)}\right)^3$ |
| fiber-plane (fp) | $\dfrac{\pi}{8\sqrt{2}} \dfrac{1}{(1-e)^{5/2}} \left(\dfrac{z_{cut}}{R}\right)^3$ |
| fiber-fiber (ff) | $\dfrac{4 z_{cut}^3}{R^2} \int_0^R \int_0^R \dfrac{dx\, dy}{2R - \sqrt{R^2 - x^2} - \sqrt{R^2 - y^2}}$ | e = fraction of surface embedding
$z_{cut}$ = minimum Casimir separation distance ≈ 1.65 Å
x, y = the planar coordinates within the fiber-fiber overlap rectangle (i.e., region (tt))

Figure 6:
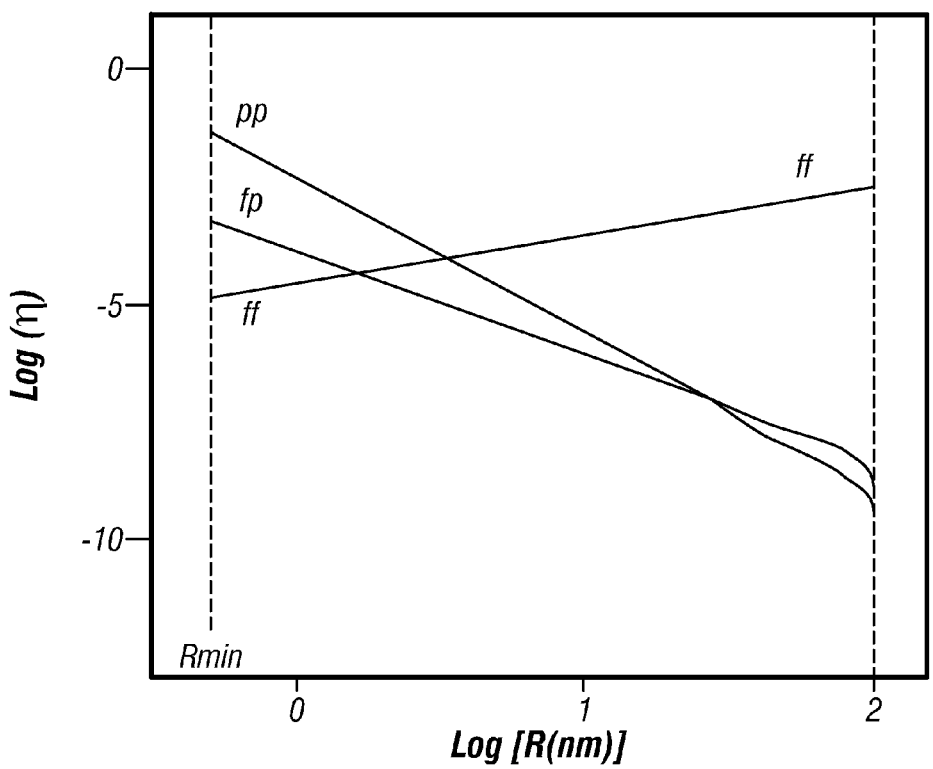
FIG. 6 is a graph depicting stiction coefficients as a function of nano-fiber radius.

The effective stiction coefficient f for each region is given by the product of the geometric surface overlap (as given in Table 1) and the Casimir weighting function (as given in Table 2) for each region (i.e., $\eta = \eta_1 \eta_2$). The total effective stiction coefficient for two orthogonally-oriented nano-fiber embedded surfaces is given by the sum of the stiction coeffecients for each region (i.e., $\eta_T = \eta_{ff} + \eta_{fp} + \eta_{pp}$). FIG. 6 is a graph plotting the stiction coefficients of the three regions as a function of nano-fiber radius from 0.5 nm to 200 nm for a surface having nano-fibers 50% embedded (e=0.5) with parallel spacings of 200 nm (L=200 nm). This graph demonstrates that the total stiction coefficient can be varied over roughly a factor of 200 by adjusting the nano-fiber radius alone and that the primary contributor to adhesive forces for most radii is the fiber-fiber interaction. For 20 nm diameter nano-fibers, the total stiction coefficient, $\eta_T$, is $5 \times 10^{-4}$, which is more than three orders of magnitude less than that for two metallic planar surfaces in direct contact.

Due to the atomically smooth surfaces provided by some nano-fibers, sliding friction between an orthogonally-oriented contact between nano-fiber embedded surfaces should not be affected by microscopic surface asperities, which is the primary source of classical macroscopic friction. Instead, the frictional forces should be proportional to the contact surface area between the orthogonally contacting nano-fibers. The classical geometric approximation of a cylinder implies zero contact area (i.e., point contacts). However, an effective contact surface area can be approximated by assuming that frictional forces apply over the area of the nano-fibers that are within the van der Waals cut-off distance (e.g. $z_{cut}$=1.65 Å). The effective contact fraction for friction, $\beta_1$, can be defined as the ratio of this effective area to the geometric area. The frictional force (kinetic or static) is then given by:

$$F = \beta_1 fA \quad (3)$$

where f is the kinetic or static friction force of contacting nano-fibers per unit area and A is the geometric overlap area (i.e., the (tt) overlap regions in FIG. 5). For 20 nm diameter nano-fibers, $\beta_1$ is approximately $3.2 \times 10^{-2}$. Studies using telescoping carbon multi-walled nanotubes have demonstrated a static force of friction per unit area of $6.6 \times 10^{-15}$ N/Å$^2$ and a kinetic force of friction of $4.3 \times 10^{-15}$ N/Å$^2$ per unit area for contacting nanotubes. These values may be used as an approximation of the friction forces per unit area f in carbon nanotubes.

Under load, hollow nanotubes may flatten, thereby increasing their effective contact area. This effective contact area may be estimated by determining the flattened surface area in view of the loading force and the nanotubes' Young's modulus. Using this methodology, it can be shown that the kinetic and static coefficients of friction for the contact between orthogonally-oriented nanotube embedded surfaces with 20 nm diameter carbon nanotubes spaced at 200 nm is approximately $2 \times 10^{-4}$ to $3 \times 10^{-4}$. These coefficients are roughly three orders of magnitude less than those of typical materials.

It will be appreciated that, in general, contact between two surfaces having partially embedded nano-fibers can result in low friction and low adhesion whenever the nano-fibers in one surface contact nano-fibers in another surface at an angle. Thus, for example, surfaces comprising arrays of partially embedded nano-fibers may be contacted with each other at any non-zero angle such as from about 20° to about 90° or from about 45° to about 90°. It will be appreciated that by varying the spatial coverage fraction of the nano-fibers on the substrate, varying the spacing of the nano-fibers, and/or varying the nano-fiber dimensions, calibrated, reproducible adhesion and friction values can be engineered into a surface over several orders of magnitude. Although the lowest adhesion and friction values can be obtained by using nano-fibers embedded in both contact surfaces, some embodiments include contacting a smooth unadorned surface with one containing partially embedded nano-fibers.

In some embodiments, two substrates having partially embedded nano-fibers as described above are used in a system where it is desirable to have low friction and/or low adhesion. For example, many NEMS or MEMS structures include two surfaces that slide against each other or repeatedly contact each other. If the two surfaces have partially embedded nano-fibers arranged such that the respective sets of nano-fibers contact each other at an angle, the low friction and low adhesion effects described above can be achieved to enhance operation of such NEMS or MEMS. Non-limiting examples of NEMS or MEMS structures where nano-fiber embedded surfaces may be advantageous include micro switches, motors, and cantilevers. In some embodiments, an electric field is applied to control movement of one nano-fiber embedded surface relative to another (e.g. such as by applying a potential difference between the two surfaces). In other embodiments, the nano-fiber embedded surfaces may be used in macroscopic systems. For example, in one embodiment, a pair of such surfaces contacting each other at an angle may be positioned between an object and a base surface to facilitate movement of the object across the base surface. In another embodiment, nano-fiber embedded surfaces may be used as low-friction motor brushes.

In some embodiments, two contacting nano-fiber embedded surfaces are used as an electrical or thermal contact. Due to the high electrical conductivity of certain nano-fibers (e.g. carbon nanotubes) and the high curvature of the nano-fibers at the point of contact, nano-fiber embedded surfaces as described above can provide good electrical contact between them. Thus, such surfaces are well suited to electrical switching applications. Similarly, due to the high axial thermal conductivity of certain nano-fibers, these surfaces can also exhibit good thermal transfer upon contact, making them suited to applications where heat flow is mechanically switched or gated.

While not being bound by any particular theory or material characteristics, it is also believed that using contacting nano-fiber embedded surfaces in the applications discussed above has the advantage of low wear and high durability. Specifically, if chemically identical materials are used, adhesive wear may be minimal and the material's equal hardness may result in low abrasion. In addition, the pattern of the embedded nano-fibers may serve to urge any contaminants away from the points of contact and thus be self cleaning. When bare carbon nanotubes are used, the surface will be naturally hydrophobic and thus resistant to water and other polar solvents. If the underlying substrate is more hydrophilic, polar liquids should be wicked away from the contact surfaces. In addition, since many nano-fibers can flex repeatedly without fatiguing or cracking, surface fatigue wear may be low. Finally, owing to nanotubes' ability to radially deform, they should be resistant to collision, potentially increasing the life of NEMS and MEMS devices that involve high speed impact between contact surfaces.

Figure 7A:
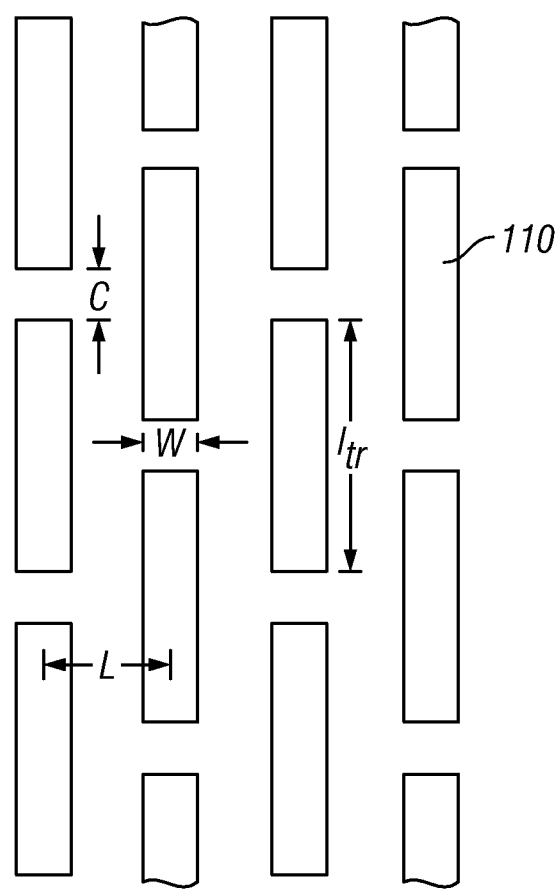
FIGS. 7A-7C are top planar views of various trench arrangements for a partially embedded nano-fiber surface.

In some embodiments, the nano-fibers are placed within trenches dimensioned such that only one nano-fiber is present in each occupied trench (i.e., the trenches have a width and length approximately equal to the nano-fibers' width and length). One such array of trenches is depicted in FIG. 7A. This array comprises columns of trenches 110 where each column comprises trenches 110 aligned end-to-end with a spacing c between the ends of the trenches 110. Each trench 110 has a length $l_{tr}$ and a width w. Adjacent columns have a spacing of L. In the embodiment depicted in FIG. 7A, the alignment of the ends of the trenches 110 are staggered from column to column.

Figure 7B:
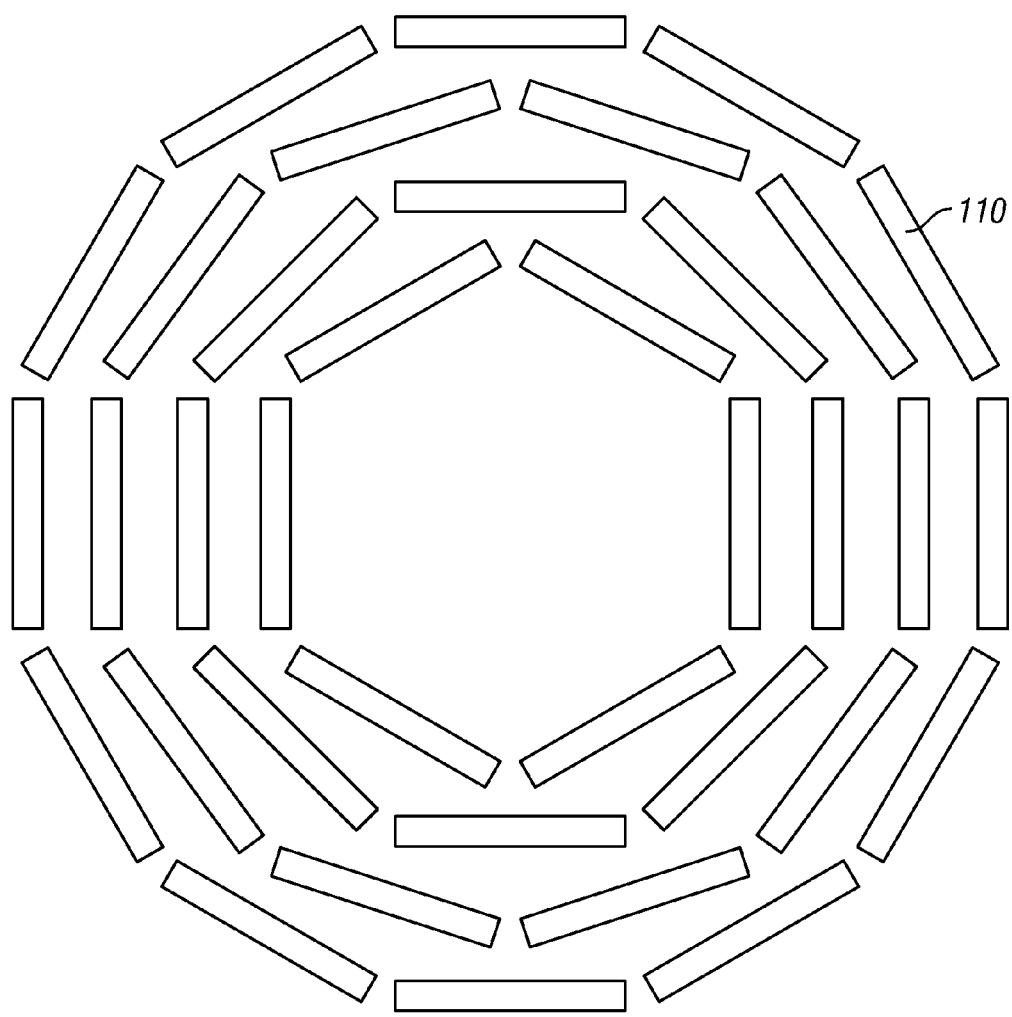
Figure 7C:
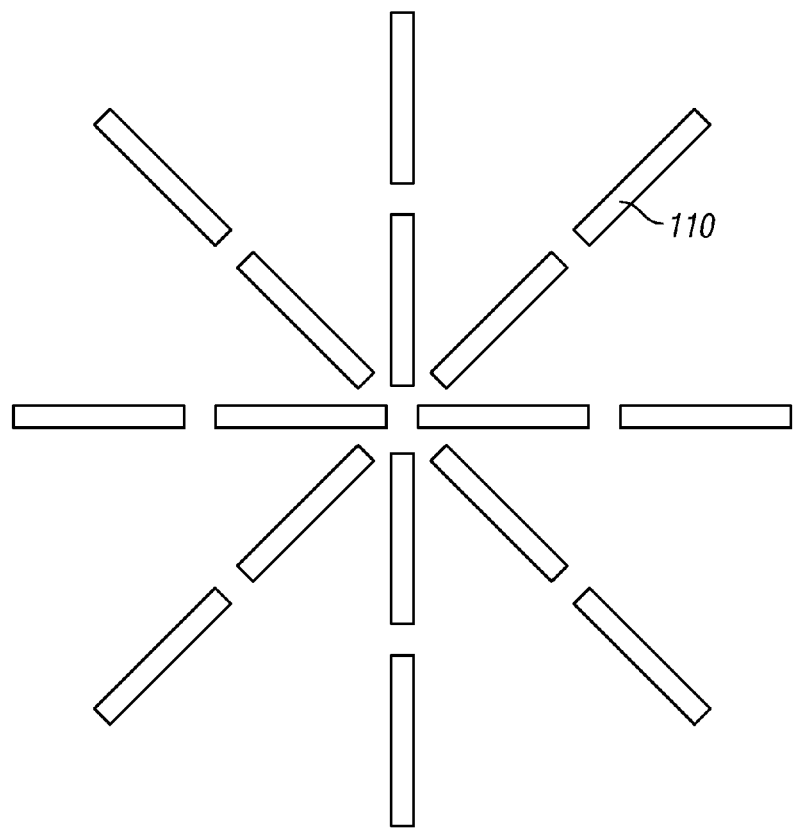

FIG. 7B depicts one alternative arrangement of trenches 110. In this embodiment, the trenches form a series of concentric circles. FIG. 7C depicts a radial arrangement of trenches 110. When the array depicted in FIG. 7B is contacted with the array depicted in FIG. 7C and aligned appropriately, the two sets of nano-fibers will contact each other at near orthogonal angles. Thus, the ultra-low adhesion and ultra-low friction effects described above for orthogonally-oriented parallel arrays of nano-fibers will be present. In particular, contact between these arrays of nano-fibers is well suited for applications that include rotational motion, such as an ultra-low friction circular bearing.

As described above, one use of partially embedded nano-fiber surfaces is their contact at angles to achieve low friction and low adhesion. Other useful applications involve contacting two partially embedded nano-fiber surfaces in such a way that their respective nano-fibers are approximately parallelly aligned. Due to the increased contact area between the nano-fibers and also possible nano-fiber-substrate contact, the van der Waals forces will be significantly increased as compared to orthogonal contact. One application of this effect is to selectively control the adhesion between two surfaces by rotating them. For example, in the parallel configuration, the two surfaces might be tightly bound together. However, upon rotation by 90°, the adhesive force may decrease 100 to 1000 fold, essentially providing a controllable molecular "suction cup." In another related application, electrostatic dipoles may be generated by application of a voltage across the nano-fibers' length due to certain nano-fibers' high polarizability. If two surfaces containing such charged parallelly aligned nano-fibers are in contact, their angle of contact may be controlled by application of appropriate voltages.

Figure 8:
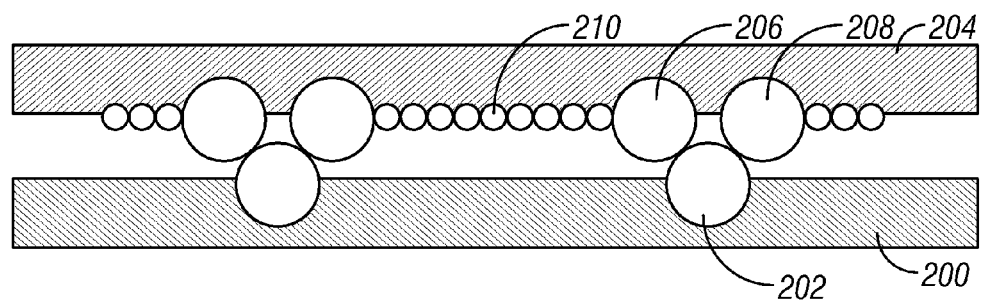
FIG. 8 is a cross-sectional view of two surfaces comprising partially embedded nano-fibers contacting each other at parallel angles.

Another application of parallelly aligned nano-fiber-embedded surfaces is an incremental nano-translation stage. FIG. 8 depicts such a stage in cross-section. A first substrate 200 comprises evenly spaced embedded nano-fibers 202. A second substrate 204 comprises a pair of nano-fibers 206 and 208 spaced to form a seat for the nano-fibers 202 in the first substrate. The nano-fiber pair 206 and 208 may be repeated in an evenly spaced fashion over the second substrate 204. When the surfaces are aligned and positioned such that the nano-fibers 202 in the first substrate 200 are seated within the nano-fiber pairs 206 and 208, the substrates 200 and 204 are relatively stable with respect to lateral motion. If enough lateral force is applied to unseat the nano-fibers 202, the substrates will move relative to each other until the nano-fibers 202 are seated in the next adjacent nano-fiber pairs 206 and 208. In some embodiments, smaller diameter nano-fibers 210 are provided in between the nano-fiber pairs 206 and 208 to increase the sliding resistance in between stages. Thus, an apparatus may be provided that has well-defined incremental lateral positions. A mechanical actuator may be coupled to one of the substrates to effect the lateral motion. Such a device could be used in applications requiring high precision positioning, such as sub-wavelength controlled optical applications.

Figure 9A:
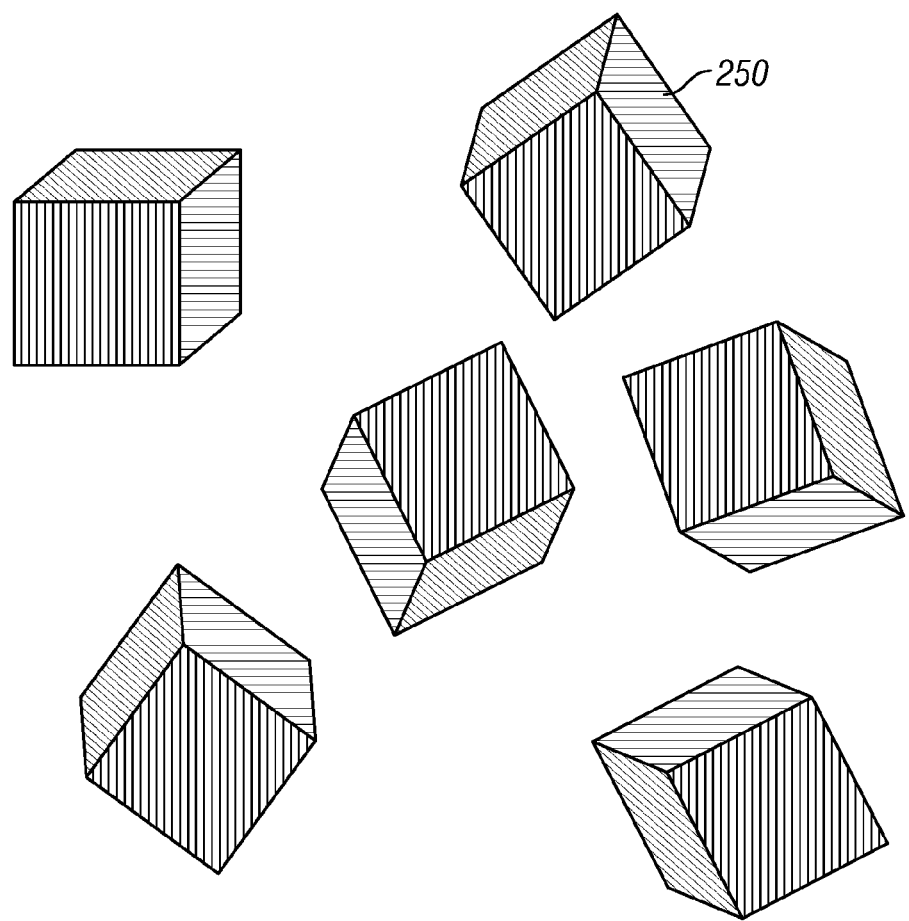
FIG. 9A is a perspective view of a plurality of three-dimensional elements having partially embedded nano-fibers in their surfaces.
Figure 9B:
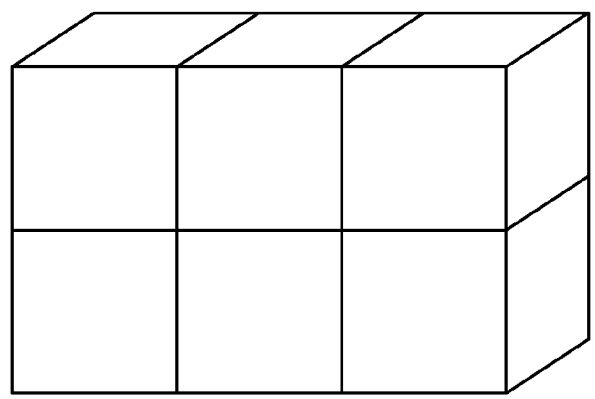
FIG. 9B is a perspective view of the elements of FIG. 9A self assembled into a higher order structure.

As noted above, the adhesive forces for parallelly aligned nano-fibers are significantly higher than orthogonally oriented nano-fibers. Thus, it is energetically favorable for two nano-fiber arrays to align in a parallel fashion. This characteristic provides opportunities for self-assembly of nanoscopic or microscopic structures including the self-assembly of patterned electrical circuits. For example, in the absence of any other forces or mechanical restrictions, two orthogonally-oriented nano-fiber-embedded surfaces will have the tendency to self-rotate to achieve a parallel alignment. These self-assembly characteristics can be used force a collection of three-dimensional objects to assembly into a higher order structure. For example, FIG. 9A depicts a plurality of cubes 250 containing parallelly aligned embedded nano-fibers in their surfaces. By appropriately choosing the spacing, orientation, and arrangement of the nano-fibers in each surface, the collection of cubes can be induced to self-assemble into a higher order structure such as depicted in FIG. 9B. By choosing from a variety of shapes for the individual elements and a variety of nano-fiber patterns, it will be appreciated that intricate self-assembled structures can be created. These structures may also exhibit self-healing properties in that damage to the higher-order structure (but not the individual elements) will spontaneously be corrected as the structure returns to a low-energy configuration.

Methods of manufacturing surfaces having nano-fibers partially embedded therein may include forming a plurality of trenches in a substrate followed by placing nano-fibers within the trenches. The substrate may include any desired material including conductors, semiconductors, or insulators. In some embodiments, the substrate is a metal or silicon. In some embodiments, the substrate is rigid. In other embodiments, the substrate is flexible, such as a tape or film like structure. In some embodiments, the surfaces into which the trenches are formed have optical or better-than-optical flatness. Techniques for producing such surfaces are known to those of skill in the art. The trenches may be arranged in any suitable pattern, for example, the patterns depicted in FIGS. 7A-7C. Those of skill in the art will appreciate many known micromachining methods that may be used to form the trenches by selectively removing material from the substrate. Non-limiting examples include photolithography and electron beam lithography. Alternatively, material may be selectively added to a substrate to form the trenches, for example, by using molecular beam epitaxy. In some embodiments, the trenches have dimensions (e.g. width and length) that are similar to the dimensions of the nano-fibers that are to be embedded.

Nano-fibers may be obtained using known methods or from commercial sources. For example, carbon nanotubes may be produced by techniques such as laser ablation, chemical vapor deposition, carbon arc growth, and laser-assisted catalytic growth. In some embodiments, physical and/or chemical post production processes are used to select the desired nano-fiber lengths and improve their uniformity. Nanotubes may either be capped (e.g. by using a hemisphere of a buckey ball) or open.

Once the trenches are formed, the nano-fibers may be positioned within the trenches using any number of techniques. In some embodiments, due to the adhesive forces between the nano-fibers and the surfaces in the trenches, the nano-fibers have the natural tendency to self-assemble into the trenches because it is more energetically favorable for the nano-fibers to be fully seated in the trenches as compared to being completely or partially outside of the trench. In some embodiments, the nano-fibers and inside surfaces of the trenches are chemically functionalized such that chemical or hydrogen bonding occurs between the nano-fibers and the inside of the trenches. These techniques further promote self-assembly and increase the stability of the nano-fibers once they are embedded. In one embodiment, the outside surface of the nano-fibers contain carboxyl groups (such as by oxidizing carbon nanotubes) and the inside surface of the trenches contain amino groups. In this embodiment, peptide bonds are formed between the nano-fibers and the inside of the trenches.

Figure 10:
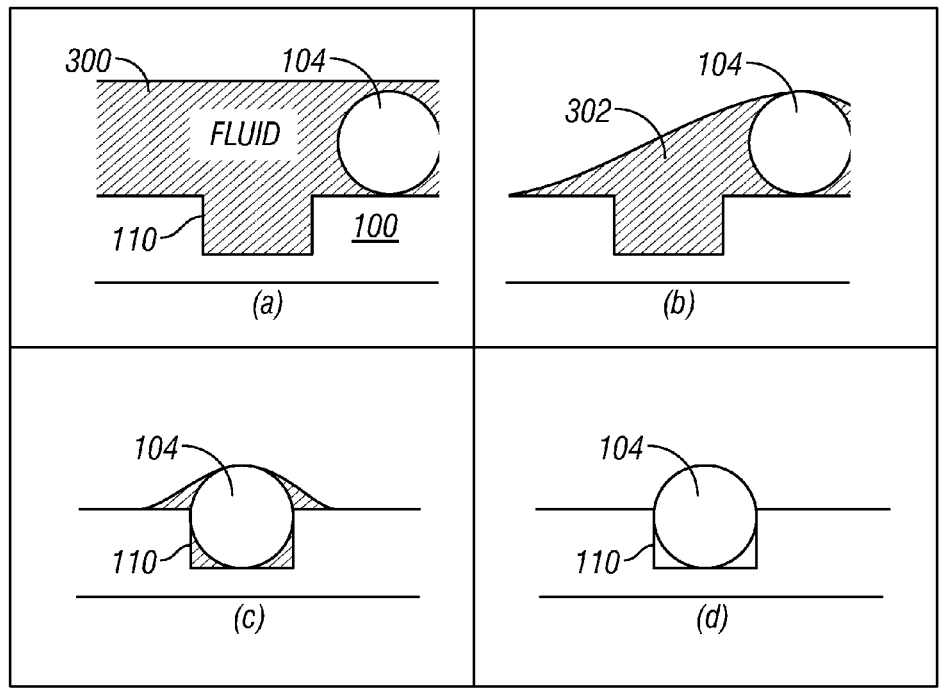
FIG. 10 contains cross-sectional views of a nano-fiber being positioned within a trench using evaporating liquid.

The nano-fibers may be introduced to the surface of the substrate by any number of methods. Certain nano-fibers have the tendency to self-aggregate. Accordingly, in some embodiments, nano-fibers are deposited onto the substrate in a dispersed form, such as a dry cloud of aerosolized nano-fibers or as a suspension or solution in a liquid. Production of dry or wet aerosols may be produced using known methods such as nebulizers, atomizers, or inkjet printer technology. FIG. 10 is a cross-sectional view depicting the placement of a nano-fiber 104 into a trench 110 utilizing a liquid 300. As depicted in panel (a) of FIG. 10, the nano-fiber 104 is dispersed within a liquid 300. The liquid 300 may then be evaporated by heating the substrate 100 and/or reducing the atmospheric pressure. As the liquid 300 evaporates, the nano-fiber will be drawn into droplets 302 as depicted in panel (b) in FIG. 10. As the droplets 302 shrink, they will have the tendency to gravitate to the trenches 110 due to capillary forces, thereby "dragging" the nano-fibers 104 into the trenches 110 as depicted in panel (c) in FIG. 10. Finally, as depicted in panel (d) in FIG. 10, the liquid will completely evaporate, leaving the nano-fibers 104 positioned within the trenches 110.

In some embodiments, the substrate may be vibrated to accelerate nano-fibers being fully seated within trenches. Such vibration may be used in combination with any deposition method, including the liquid based deposition described above.

In some embodiments, after deposition and positioning of the nano-fibers, nano-fibers that are not fully seated in trenches are removed using any suitable physical or chemical method. In some embodiments, the substrate is exposed to a gas jet to remove nano-fibers that are not tightly bound. In other embodiments, an adhesive, such as an adhesive tape, is placed over the substrate and then removed, thereby removing untightly bound nano-fibers. In still other embodiments, ultrasonic energy is supplied to remove unseated nano-fibers. In some embodiments, multiple deposition and removal cycles are applied to increase the percentage of trenches occupied.

Figure 11A:
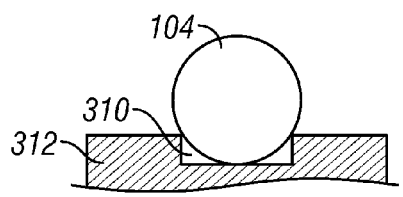
FIGS. 11A-11C are cross-sectional views of a nano-fiber being embedded in a substrate using a sacrificial material.
Figure 11B:
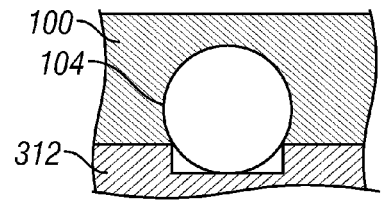
Figure 11C:
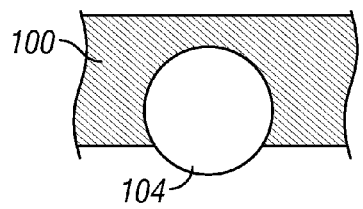

FIGS. 11A-11C are cross-sections depicting a manufacturing method useful for generating nano-fibers seated in semi-circular shaped trenches. First, trenches 310 may be formed in a sacrificial material 312 using any of the methods described above. In some embodiments, the trenches 310 have a rectangular cross-section. As depicted in FIG. 11A, nano-fibers 104 may then be positioned within the trenches 310 using any of the methods described above. In some embodiments, the trenches 310 are shallow such that more than half of the nano-fibers' 104 diameter extend above the surface of the sacrificial material 312. Next, as depicted in FIG. 11B, substrate material 100 is deposited on the nano-fiber 104/sacrifical material 312 composite such that the nano-fibers 104 are completely encased. Finally in FIG. 11C, the sacrificial material 312 is removed using a suitable etchant, resulting in the nano-fibers 104 being partially encased in the substrate 100. In the case where shallow trenches 310 are used, the nano-fiber 104 will be more than 50% encased in the substrate 100, resulting in a very stable structure.

EXAMPLE

Figure 12A:
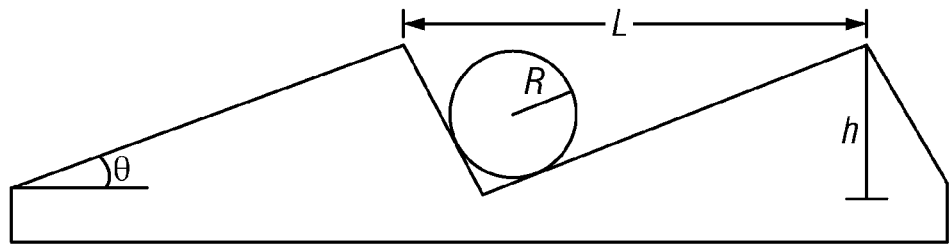
FIGS. 12A-12B are cross-sectional views depicting trenches present in a diffraction grating.

To demonstrate the manufacture of partially embedded nano-fibers, multi-walled carbon nanotubes were placed within the grooves (trenches) of an ultraviolet-ruled diffraction grating. The grating had 1200 lines/mm with a blaze angle of 0.15 radians and a blaze wavelength of 250 nm. The nanotubes had lengths ranging from about 0.5 μm to about 2.0 μm with diameters ranging from about 50 nm to about 80 nm. FIG. 12A is a cross-sectional view of the desired result, with the nanotubes seated in the nook of the diffraction grating grooves. With the dimensions used, well-seated nanotubes will not protrude above the grating surface plane.

Figure 12B:
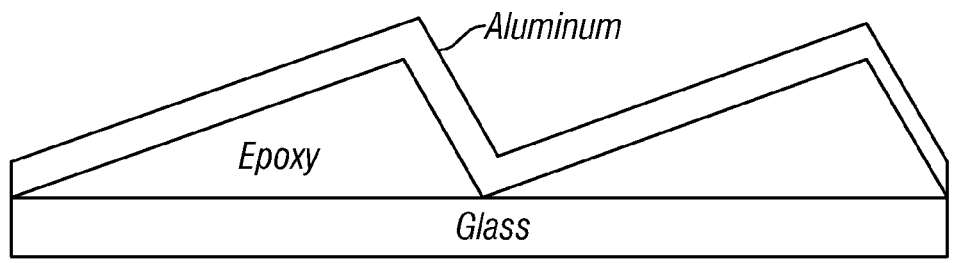
Figure 12C:
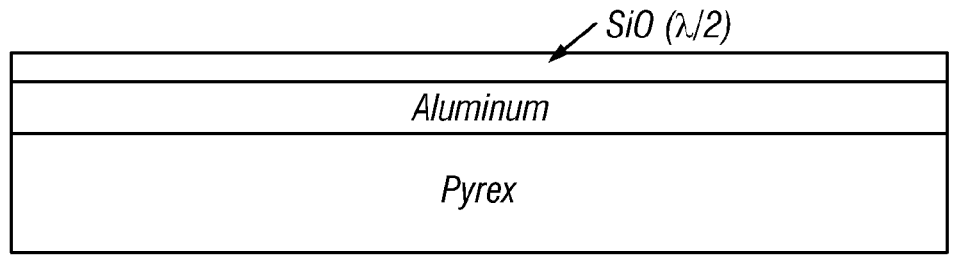
FIG. 12C is a cross-sectional view an optically flat control surface.
Figure 14A:
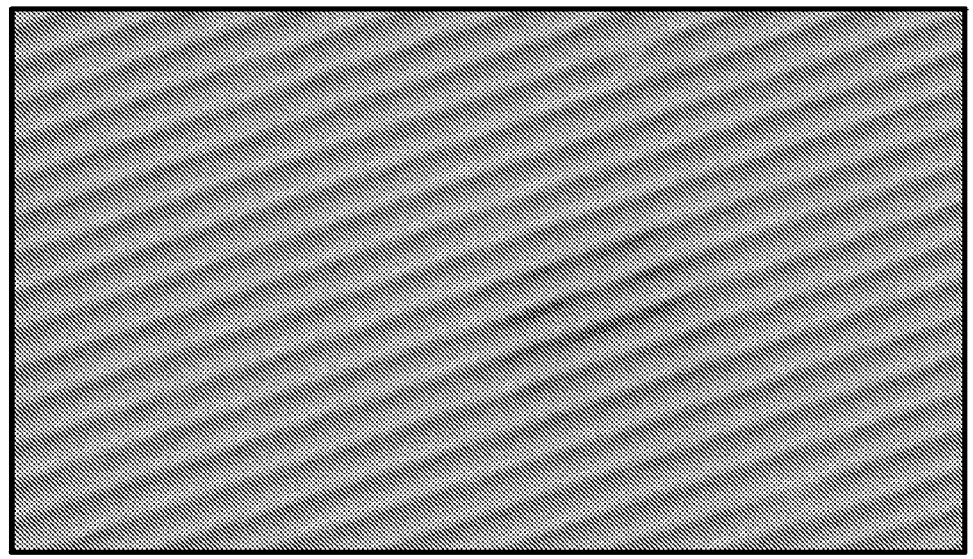
FIGS. 14A-14B and 15A-15B are scanning electron micrographs depicting the positioning of carbon nanotubes within the trenches of a diffraction grating.
Figure 14B:
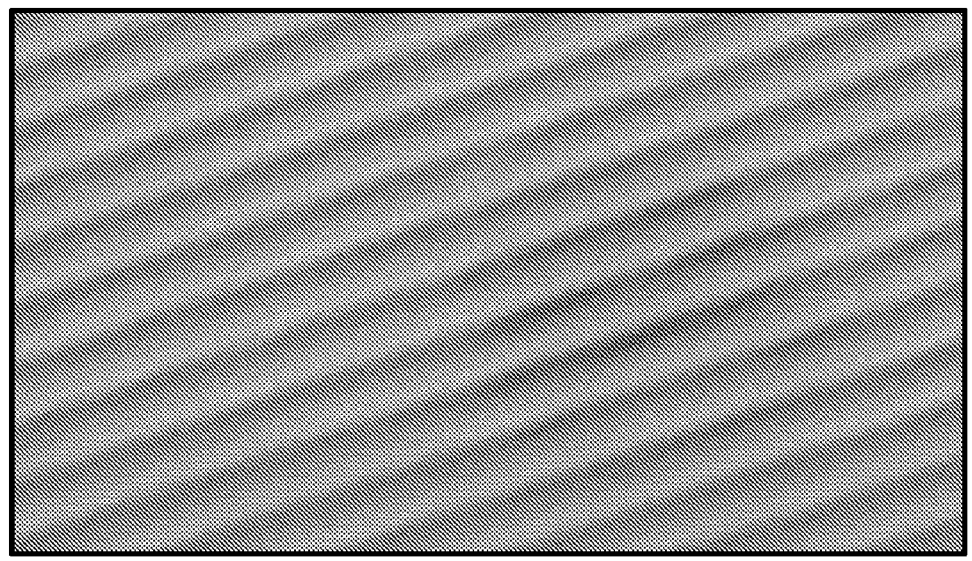
Figure 15A:
Figure 15B:
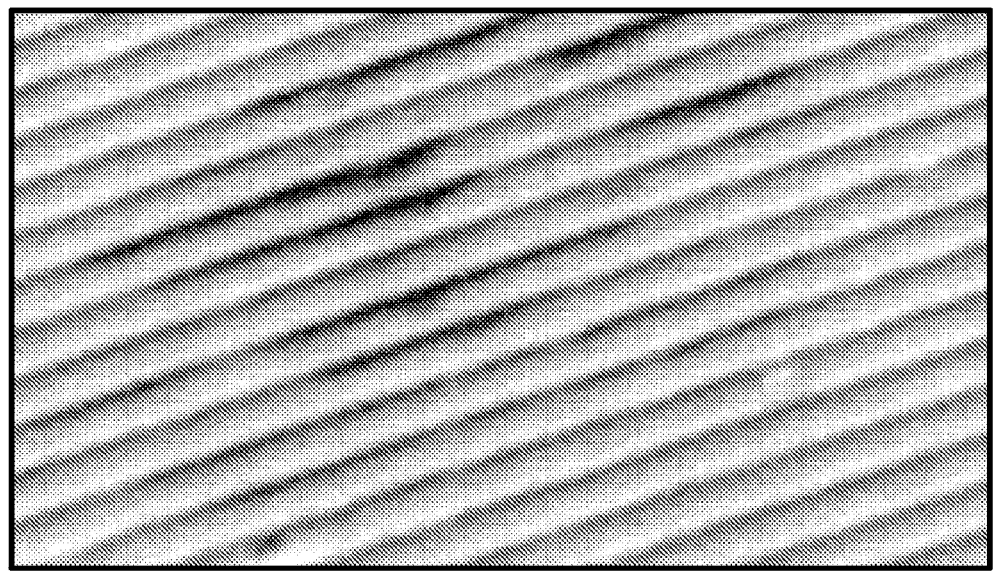

FIG. 12B depicts the construction of the grating used, which included optically polished glass covered with a thin epoxy, which was ruled and then coated with aluminum. Two optically flat control surfaces were used. The first, depicted in FIG. 12C, was a mirror comprising aluminum deposited on Pyrex protected by a half-wave silicon dioxide coating. The second was glass sputter-coated with gold-palladium alloy.

In order to deposit the nanotubes on the gratings in a dispersed fashion, an ultrasonic atomization generator was constructed as depicted in FIG. 13. The generator included a 950 ml glass vessel 400. Carboxylic acid functionalized multi-walled carbon nanotubes were dissolved in approximately 450 ml of de-ionized water with a concentration of 30 mg/L. The solution was sonicated at 40 kHz for 3 hours followed by filtration using P2 and P5 filters. The solution was then placed in the vessel 400. A medium frequency piezoelectric atomizer 402 was placed in the solution and driven at approximately 1.3 MHz to 1.7 MHz for 3 hours. The atomizer generated a thick aerosol of water droplets having an approximate size of 3 μm to 5 μm. The aerosol was forced out of the vessel 400 through an application tube 404 by a helium carrier gas stream. The gas stream carrying the nanotube aerosol was then directed onto the target surface. The helium gas flow rate was selected such that flow through the application tube 404 was laminar near the laminar-to-turbulent transition (approximately 30 $cm^3$/s).

The droplets from the nanotube aerosol deposited onto the target surface and then evaporated, leaving behind deposited carbon nanotubes. The deposited droplet size was confirmed by calibrated light microscopy after freezing the droplets on a glass slide. The piezoelectric driver 400 heated the nanotube solution to approximately 60° C. This temperature improved deposition efficiency by increasing the water vapor pressure in the aerosol stream, thereby causing water condensation on the target surface, which primed the surface for adhesion of the water droplets.

At the gas flow rates used, a one second dose of nanotube aerosol deposits roughly one monolayer of nanotubes ($10^6$ nanotubes per $cm^2$). Target surfaces were dosed with combinations of 1, 3, 10, and 100 monolayers. Full evaporation of droplets was allowed between each of multiple exposures. Two evaporation methods were used: 1) drying in still air for 1, 3, and 10 monolayer depositions and 2) drying with a helium jet for 1, 10, and 100 monolayer depositions. After deposition, the surfaces were examined using a scanning electron microscope.

Scans of the un-trenched control surfaces showed no evidence of nanotubes. It is believed that the nanotubes on these surfaces were laterally displaced or electrostatically levitated by the microscope's electron beam. However, scans of the trenched ultraviolet gratings indicated seating of nanotubes within the trenches. FIGS. 14A and 14B depict an SEM scan of one region of the diffraction grating under 5850 and 9100 magnifications, respectively, after a single monolayer of dosing. FIGS. 15A and 15B depict an SEM scan of a different region under 2280 and 7150 magnifications, respectively, after a single monolayer of dosing. The dominant parallel line structures appearing in the micrographs are the grooves of the gratings. The roughly circular regions of discrete darker striations near the center of each field are believed to be carbon nanotubes lying within the grooves. The lengths of the striations (1-5 μm) are consistent with the size of the nanotubes. The nanotubes appear in the deepest region of the grating trenches. The size of the circular region in FIGS. 14A and 14B (5 μm) roughly corresponds to the size of single water droplet from the nanotube aerosol. The size of the circular region in FIGS. 15A and 15B (12 μm) suggests the coalescence of a number individual droplets. At higher dosings of depositions, amorphous mats of nanotubes were formed suggesting that initially-deposited nanotubes act as traps for later droplets.

Although the invention has been described with reference to embodiments and examples, it should be understood that numerous and various modifications can be made without departing from the spirit of the invention. Accordingly, the invention is limited only by the following claims.

What is claimed is:

1. An apparatus, comprising a nano-electromechanical system (NEMS) or micro-electromechanical system (MEMS), wherein the NEMS or MEMS comprises as at least one component:

a substrate comprising a surface; and a plurality of substantially straight nano-fibers, each having a longitudinal dimension, said nano-fibers partially embedded in the surface such that a portion of the embedded nano-fibers extend above the surface along said longitudinal dimensions, wherein the nano-fibers are arranged such that said longitudinal dimensions are substantially parallel to the surface, wherein all of said nano-fibers partially embedded in the surface are in substantially a same plane.

2. The apparatus of claim 1, wherein the surface is locally flat with respect to the length of the nano-fiber.

3. The apparatus of claim 1, wherein the embedded nano-fibers in the surface are substantially parallel to each other.

4. The apparatus of claim 1, wherein the embedded nano-fibers are arranged in a concentric circular pattern.

5. The apparatus of claim 1, wherein the embedded nano-fibers are arranged in a radial pattern.

6. The apparatus of claim 1, wherein the nano-fibers are nanotubes.

7. The apparatus of claim 6, wherein the nanotubes are carbon nanotubes.

8. The apparatus of claim 7, wherein the carbon nanotubes are single-walled carbon nanotubes.

9. The apparatus of claim 7, wherein the carbon nanotubes are multi-walled carbon nanotubes.

10. The apparatus of claim 1, wherein the embedded nano-fibers are positioned within trenches in the surface of the substrate.

11. The apparatus of claim 10, wherein the trenches have an approximately rectangular cross section.

12. The apparatus of claim 10, wherein the trenches have an approximately semi-circular cross section.

* * * * *